United States Patent
Raha et al.

(10) Patent No.: US 7,978,802 B1
(45) Date of Patent: Jul. 12, 2011

(54) METHOD AND APPARATUS FOR A MESOCHRONOUS TRANSMISSION SYSTEM

(75) Inventors: Prasun K. Raha, Redwood City, CA (US); Donald Stark, Palo Alto, CA (US); Dean Liu, Sunnyvale, CA (US); Pak Shing Chau, San Jose, CA (US)

(73) Assignees: Xilinx, Inc., San Jose, CA (US); NetLogic Microsystems, Inc., Santa Clara, CA (US)

( * ) Notice: Subject to any disclaimer, the term of this patent is extended or adjusted under 35 U.S.C. 154(b) by 942 days.

(21) Appl. No.: 11/974,362

(22) Filed: Oct. 12, 2007

(51) Int. Cl.
*H04L 7/00* (2006.01)
(52) U.S. Cl. ......................... 375/371; 375/376
(58) Field of Classification Search ............... 375/371, 375/372, 373, 375, 376, 357
See application file for complete search history.

(56) References Cited

U.S. PATENT DOCUMENTS

| | | | |
|---|---|---|---|
| 7,162,553 B1 * | 1/2007 | Xue et al. | 710/71 |
| 7,317,775 B1 * | 1/2008 | Erhart et al. | 375/355 |
| 7,336,755 B1 * | 2/2008 | Tetzlaff | 375/376 |
| 7,346,794 B1 * | 3/2008 | Davidson et al. | 713/400 |

OTHER PUBLICATIONS

RocketIO Transceiver User Guide, UG024 (v2.2) Nov. 7, 2003, Xilinx, Inc. 2100 Logic Drive, San Jose, CA 95124.*

* cited by examiner

*Primary Examiner* — Chieh M Fan
*Assistant Examiner* — Jaison Joseph
(74) *Attorney, Agent, or Firm* — Michael T. Wallace

(57) ABSTRACT

A method and apparatus for a multiple lane transmission system that provides both a low latency mode of operation, while at the same time, provides reduced lane-lane skew. The overall transmission system operates as a mesochronous system, whereby each clock domain of the transmission system is synchronized to the leaf nodes of a global clock tree. A phase aligner is then used to align the phase of both the bit and byte clocks of each transmission lane to the clock signal generated at the leaf nodes of the global clock tree.

20 Claims, 4 Drawing Sheets

METHOD AND APPARATUS FOR A MESOCHRONOUS TRANSMISSION SYSTEM

FIELD OF THE INVENTION

The present invention generally relates to gigabit serial transmitters, and more particularly to reduced lane-lane skew in multiple channel transmission systems.

BACKGROUND

Communication developments in the last decade have demonstrated what seems to be a migration from parallel data input/output (I/O) interface implementations to a preference for serial data I/O interfaces. Some of the motivations for preferring serial I/O over parallel I/O include reduced system costs through reduction in pin count, simplified system designs, and scalability to meet the ever increasing bandwidth requirements of today's communication needs. Serial I/O solutions will most probably be deployed in nearly every electronic product imaginable, including IC-to-IC interfacing, backplane connectivity, and box-to-box communications.

Although the need for increased communication bandwidth continues to drive future designs, support for other communication attributes, such as reduced lane-lane skew for multiple channel communication buses and low latency modes, remain important as well. As an example, the PCI-Express (PCIe) standard specifies that the lane-lane skew for a multiple channel transmission bus is not to exceed 2 unit intervals (UI), i.e., 2 bit periods, across any of the transmission channels.

Prior art methods that reduce the lane-lane skew for multiple channel communication buses have focused on aligning the serial transmitter at the byte level, using multiple phase alignment modules in the physical coding sublayer (PCS) and associated processing at the higher link transaction layers. Other prior art methods to reduce the lane-lane skew for multiple channel communication buses have focused on aligning the serial transmitter at the bit level through the use of a barrel shifter.

Prior art lane-lane skew reduction techniques that are combined with techniques to provide low latency modes of operation, however, tend to degrade each other's performance. In particular, prior art techniques to obtain low latency modes of operation provide data paths that bypass those transmission circuit components that are sources of latency, such as elastic buffers or first-in, first-out (FIFO) buffers. However, providing data bypass paths often involves the traversal of 2 or more clock domains. Thus, while the low latency mode is successfully obtained, timing problems are also generated, since the timing relationships between the bypass data paths and all traversed clock domains may no longer be guaranteed.

Efforts continue, therefore, to solve the synchronization challenge of low latency communication systems. Such efforts are needed to insure reliable data propagation throughout the low latency communication system.

SUMMARY

To overcome limitations in the prior art, and to overcome other limitations that will become apparent upon reading and understanding the present specification, various embodiments of the present invention disclose an apparatus and method for a mesochronous transmission system that reduces lane-lane skew in multiple channel communication buses, provides a low latency mode of operation, and provides reliable data propagation across all clock domains.

In accordance with one embodiment of the invention, an integrated circuit (IC) comprises a configurable logic fabric that is coupled to receive configuration data. The configurable logic fabric includes programmable logic devices and programmable interconnections that are configured to provide data in response to a fabric clock signal, the fabric clock signal being derived from a reference clock signal. The IC further comprises a master transmitter that is coupled to the configurable logic fabric and is adapted to receive the data from the configurable logic fabric in response to a first byte clock signal and is adapted to transmit the data in response to a first bit clock signal. The master transmitter includes a first phase locked loop (PLL) that is adapted to generate the first bit clock signal in phase coherency with the reference clock signal and a first phase alignment block that is coupled to the first PLL and is adapted to generate the first byte clock signal in phase coherency with the fabric clock signal.

In accordance with another embodiment of the invention, a programmable logic device (PLD) comprises a configurable logic fabric that is adapted to provide data for transmission from the PLD, a plurality of transceivers configured to receive the data and adapted to provide a multiple channel transmission bus to transmit the data. Each of the transceivers include a physical coding sublayer (PCS) that is coupled to receive the data into an input register in synchronization with a first clock signal provided by the configurable logic fabric. The PCS includes an elastic buffer programmably decoupled from an output of the input register in a first mode. Each of the transceivers further include a physical media access (PMA) block that is adapted to receive the data from an output register of the PCS in synchronization with a second clock signal derived by the PMA block. The output register is programmably coupled to the input register to bypass the elastic buffer in the first mode. The PMA block maintains the second clock signal in phase alignment with the first clock signal in the first mode.

In accordance with another embodiment of the invention, a transmission system comprises a first transmitter that is coupled to transmit data to a transmission medium. The first transmitter includes a configurable logic fabric that is coupled to receive configuration data to configure programmable logic devices and programmable interconnections within the configurable logic fabric to provide the data in synchronization with a fabric clock signal. The first transmitter further includes a physical coding sublayer (PCS) that is coupled to receive the data into an input register in synchronization with the fabric clock signal provided by the configurable logic fabric. The first transmitter further includes a physical media access (PMA) block that is adapted to receive the data from an output register of the PCS in synchronization with a byte clock signal provided by the PMA block. The PMA block maintains the byte clock signal in phase alignment with the fabric clock signal.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
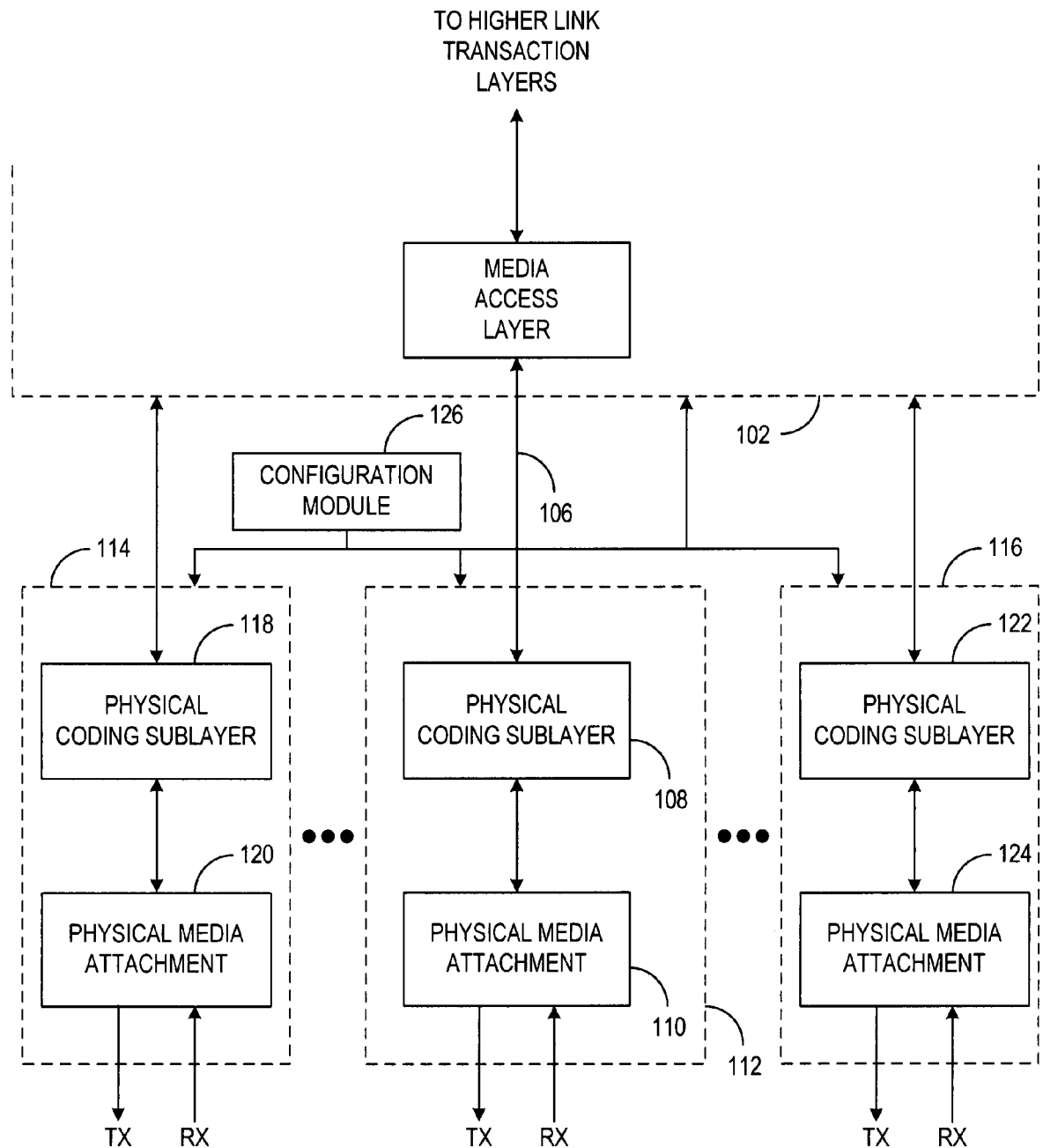
FIG. 1 illustrates exemplary communication stacks for the various PHY layers of a gigabit transceiver.

Generally, the various embodiments of the present invention are applied to a multiple lane transmission system that provides both a low latency mode of operation, while at the same time, provides reduced lane-lane skew. The overall transmission system operates as a mesochronous system, whereby each clock domain of the transmission system is synchronized to the leaf nodes of a global clock tree.

Synchronization of the transmission system is performed by achieving phase/frequency lock to a local reference. Next, the frequency of the local reference is multiplied by a phase locked loop (PLL) to generate both a bit clock and a byte clock. The bit clock is the high speed clock, which operates at approximately half of the serial data rate for double data rate (DDR) applications and operates at the serial data rate for other applications. The byte clock is the lower frequency clock that operates at data byte boundaries, where for example, the number of bits, n, for each data byte may be equal to 8 or 10 bits per byte. Both the bit clock and the byte clock are phase coherent with respect to one another and are used by the serializer/deserializer (SERDES) to provide the parallel to serial operations.

The reference clock is then routed to the core of the integrated circuit (IC) to provide the timing reference to the root of a global clock tree. Secondary circuits in the FPGA, such as an optional PLL, may be used to multiply the reference clock up to a higher frequency, such as the frequency of signal byte clock, if required. The leaf nodes of the global clock tree are then fanned out throughout all clock domains of the physical media attachment (PMA) layers and physical coding sublayers (PCS) of the transmission system.

A phase alignment block is then used to align the phase of both the bit and byte clock signals to the clock signal generated at the leaf nodes of the global clock tree. In one embodiment of the phase alignment operation, a phase interpolator is added to the feedback path of the phase locked loop. The exact phase of the phase interpolator is controlled by a phase detector in response to a phase error that is measured between the phase of the clock signal at the leaf node and the phase of the byte clock that is generated by the PLL.

The phase detector then generates an up/down command to a finite state machine (FSM), which in turn generates a digital control word to the phase interpolator that is effective to substantially remove the phase error. The overall loop settles when the phase of the bit and byte clocks are aligned with the phase of the clock signal generated at the leaf nodes of the global clock tree.

In an alternate embodiment of the phase alignment operation, the phase interpolator is utilized outside of the feedback path of the PLL. In such an instance, a synchronization operation is required to be executed at regular intervals to minimize the amount of phase error between the byte clock and the clock signal at the leaf nodes of the global clock tree.

Both embodiments may be enabled through the configuration of the programmable logic fabric of a programmable logic device (PLD) such as a field programmable gate array (FPGA). In an alternate embodiment, features of each embodiment may instead be enabled through a partial reconfiguration of the PLD. In either case, the timing relationship between the programmable logic fabric and each transmission channel is based upon the phase of the clock that is utilized within the programmable logic fabric, i.e., the clock generated by the global clock tree.

The entire transmit clock domain of the transceiver may, therefore, be shifted in phase coherency with the global clock tree. Such an arrangement allows the phase alignment to be performed within the PLL block of the transceiver, which maximizes the setup and hold margins. The arrangement further allows a reset command to be generated from a configuration module within the programmable logic fabric, which may then be used to synchronize two or more transmission lanes within the PMA portion of the transmitter. Thus, not only are the high latency devices, e.g., FIFOs, within the transmission channels allowed to be bypassed for a low latency mode of operation, but other PCS logic devices may also be bypassed to allow the transmitter to operate as a synchronous interface.

Turning to FIG. 1, an exemplary communication stack is illustrated, whereby PHY layers 112-116 are implemented within a PLD such as an FPGA. In particular, the associated PMA and PCS layers may reside within a gigabit transceiver of the FPGA, while the media access layer (MAC) and the higher link transaction layers may reside within the programmable logic portion, i.e., programmable fabric and associated processing 102, that also resides within the FPGA.

In one embodiment, PHY layer 112 may represent a PHY interface for a single gigabit transceiver, while PHY layers 114 and 116 of the FPGA may be simultaneously configured for other communication protocols. In an alternate embodiment, all of the TX interfaces of PHY layers 112-116 may be combined to form a multiple channel transmission bus that is PCIe compliant, thereby exhibiting reduced lane-lane skew in a low latency mode of operation.

PMA 110, 120, and 124 provide a SERDES function, whereby parallel data received from PCS 108, 118, and 122, respectively, may be serialized prior to transmission via the TX interface. Further, serial data received from the RX interface may be converted to parallel data prior to being delivered to PCS 108, 118, and 122. PMA 110, 120, and 124 may also incorporate a clock and data recovery (CDR) module whereby a clock signal and a data signal is derived from the input signal received at the RX interface. Once derived, the clock signal may be divided to form a parallel clock signal that is used to propagate the parallel data into the FPGA for further processing.

In an alternate transmission mode, only one PMA of PMAs 110, 120, and 124 is considered to be the master PMA, whereby the master PMA transmits the reference clock that is used to drive the root of the global clock tree (not shown) existing within programmable logic fabric 102. Clock signals from the leaf nodes of the global clock tree may then be fanned out to the remaining slave PMAs, whereby the slave PMAs phase align their respective transmission drivers to the reference clock signal that is received from their respective global clock tree leaf nodes.

Figure 2:
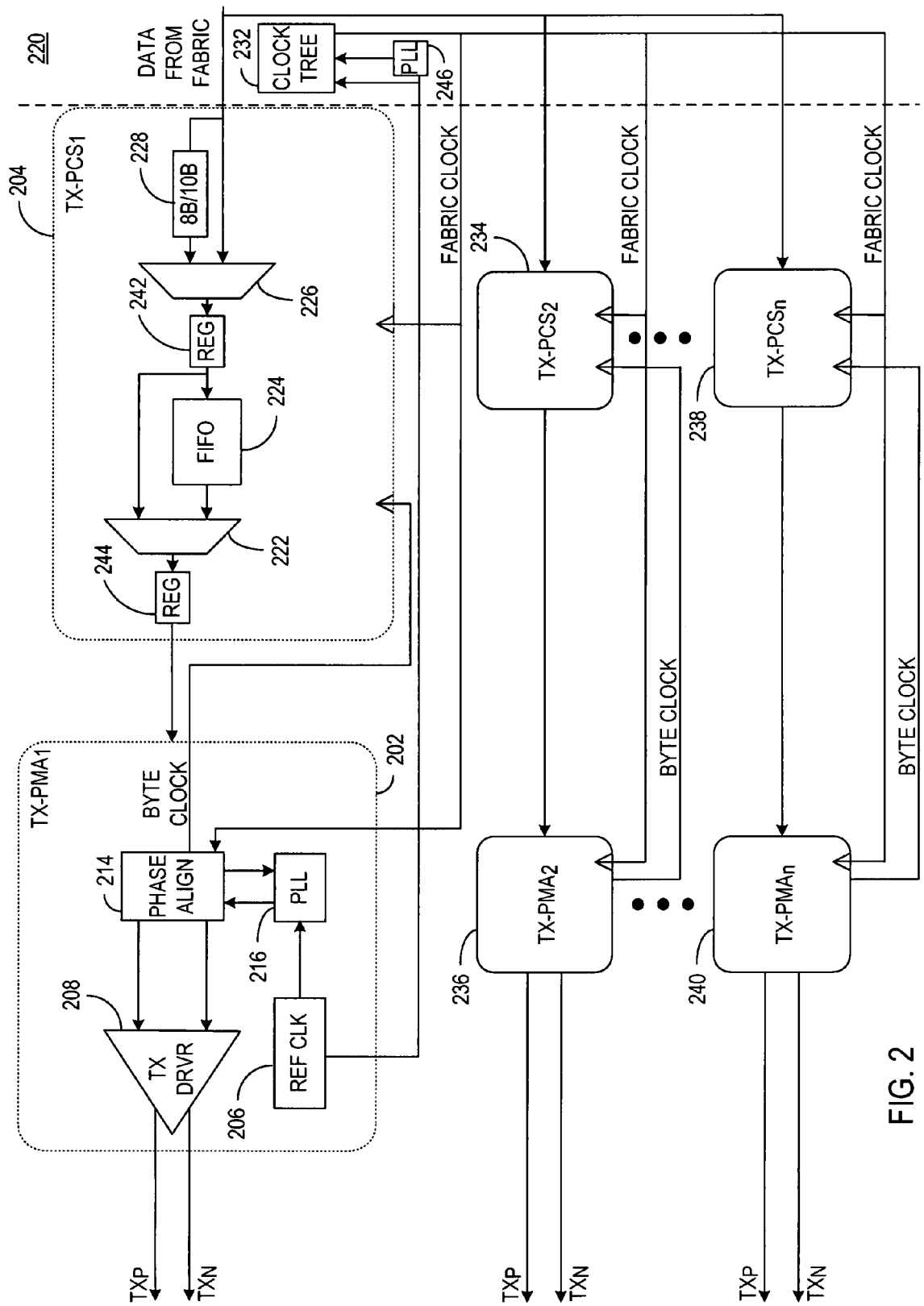
FIG. 2 illustrates an exemplary block diagram of a multiple channel transmission bus.

Turning to FIG. 2, an exemplary block diagram of a multiple channel, transmission system 220 is illustrated, whereby transmission PMA (TX-PMA) 202 is illustrated as the master PMA, while TX-PMAs 236 and 240 are illustrated as the slave PMAs. In other words, TX-PMA 202 is tasked with transmitting the reference clock signal to global clock tree 232 for dissemination by the leaf nodes of global clock tree 232. TX-PMA 202 coherently multiplies the reference clock signal received from REF CLK 206 through the use of PLL 216. TX-PMA 202 is simultaneously tasked with phase aligning the byte clock that is generated by PLL 216 to the clock signal that is generated by global clock tree 232.

Thus, synchronization of all channels of the transmission system of FIG. 2 is performed by first achieving phase/frequency lock to a local reference, e.g., REF CLK 206, and multiplying the frequency reference up to a frequency that is equal to the clock signal, i.e., byte clock, that is used to read data words from output data register 244 during a bypass mode of operation. The REF CLK 206 is also provided to the root of global clock tree 232, with or without multiplication, based on the relationship between REF CLK and byte clock. If, for example, REF CLK is at a lower frequency than byte clock, then a multiplier, such as PLL 246, may be used to multiply REF CLK to a frequency that is substantially equal to byte clock. Subsequent distribution from the leaf nodes of global clock tree 232, to TX-PCS 204, 234, and 238 and to TX-PMA 202, 236, and 240 is then performed.

PLL 216 also generates a bit clock that is phase coherent with the byte clock. The bit clock is the high speed clock, which operates at approximately half of the serial data rate for double data rate (DDR) applications and operates at the serial data rate for other applications.

Phase alignment block 214 is then utilized to phase align the bit and byte clocks to the byte clock signal that is distributed by the leaf nodes of global clock tree 232. The bit clock is then provided to a serializer (not shown) within TX-PMA 202, which serializes the parallel data coming from TX-PCS 204 prior to transmission by TX DRVR 208 via terminals $TX_P$ and $TX_N$.

As can be seen, multiplexers 222 and 226 of TX-PCS 204 are provided to allow bypassing of FIFO 224 and/or 8B/10B coding block 228, respectively, when a low latency mode of operation is desired. However, when FIFO 224 is bypassed from the transmission data path, the elastic buffering operation performed by FIFO 224 is also bypassed. In order to maintain a synchronous mode of transmission during bypass mode, therefore, the clock signals provided to input data register 242 and output data register 244 must be in a known phase relationship with respect to one another in order to facilitate reliable data transfer.

Phase alignment block 214 is, therefore, activated during bypass mode to insure that such a phase relationship exists. That is to say, in other words, that while global clock tree 232 provides the byte clock that is required to clock data bytes into input register 242, the phase aligned byte clock from phase alignment block 214 is used to clock data words out of output register 244. Given that phase alignment block 214 insures that the byte clock distributed by global clock tree 232 is phase aligned with the byte clock delivered by phase alignment block 214, reliable data propagation through TX-PCS 204 is guaranteed.

Figure 3:
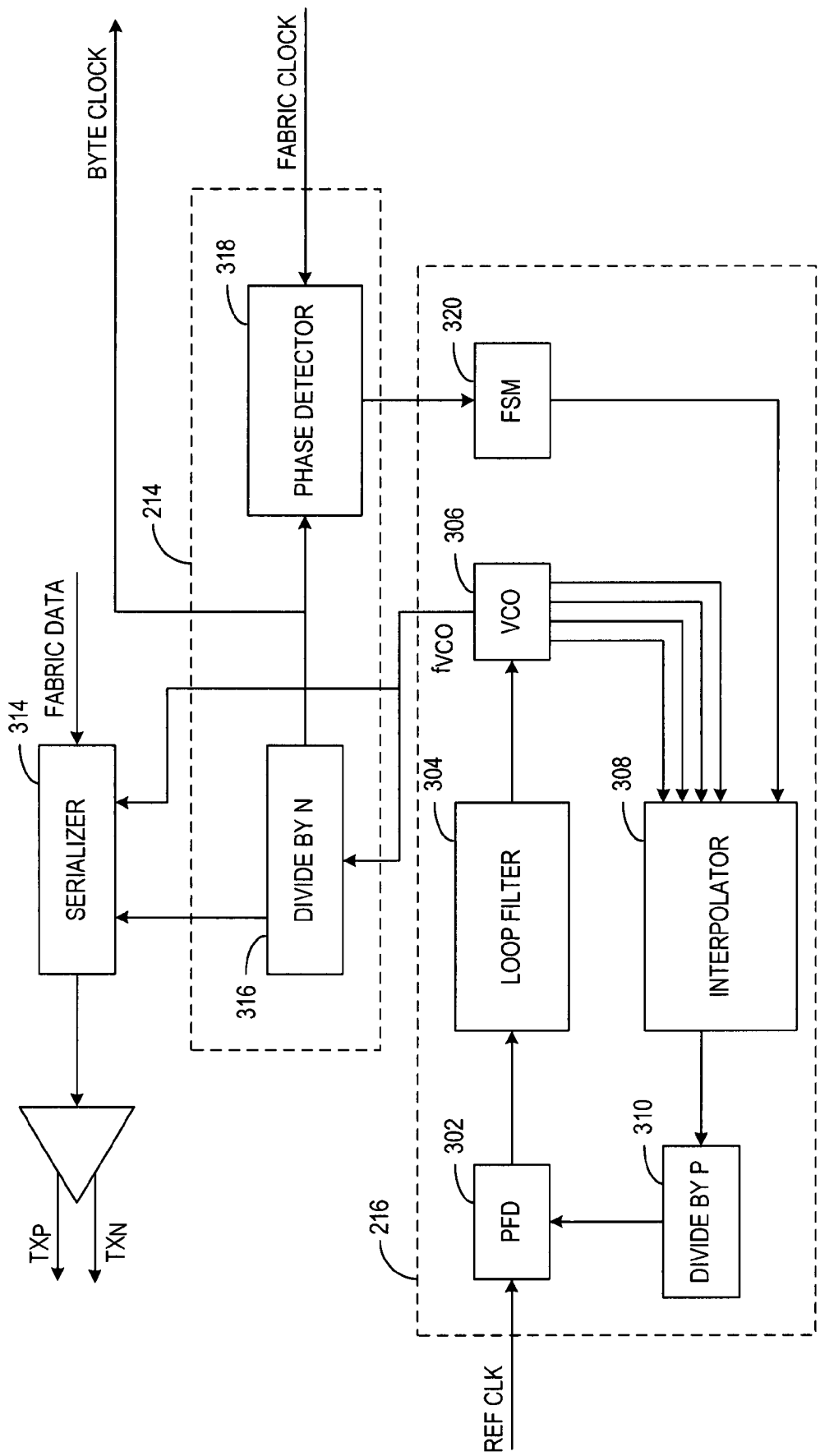
FIG. 3 illustrates an exemplary block diagram of the phase locked loop and phase alignment block portions of the multiple channel transmission bus of FIG. 2.

Turning to FIG. 3, exemplary details of phase alignment block 214 and PLL 216 of TX-PMA 202 are illustrated. In operation, PLL 216 seeks to maintain a coherent phase relationship between signal REF CLK and the bit clock that is provided by VCO 306 to Divide-by-N interger divider 316 and serializer 314. In so doing, PLL 216 includes phase frequency detector (PFD) 302 to compare the phase/frequency of signal REF CLK to a divided version of the phase/frequency of the output of voltage controlled oscillator (VCO) 306, $f_{VCO}/P$.

Any phase and/or frequency error that is detected between signal REF CLK and $f_{VCO}/P$ by PFD 302 is converted into an error signal and subsequently provided to loop filter 304. Loop filter 304 integrates the phase and/or frequency error to generate an error voltage, which is then provided to VCO 306.

In response, VCO 306 adjusts its output frequency, $f_{VCO}$, such that the phase/frequency error between signal REF CLK and signal $f_{VCO}$ is minimized.

Integrated within the feedback path of PLL 216 is interpolator 308, which is configured to receive several outputs from VCO 306. In particular, VCO 306 provides several phase variants of signal $f_{VCO}$ to interpolator 308, whereby a first variant is signal $f_{VCO}$ itself, a second variant exhibits a phase offset, X, from signal $f_{VCO}$, a third variant exhibits a phase offset, Y, from signal $f_{VCO}$ and so on.

Each of the phase variants of signal $f_{VCO}$ that are provided to interpolator 308 exhibits an integer phase offset from signal $f_{VCO}$ that is inversely proportional to the number of phase variants provided. For example, given that 4 variants are provided by VCO 306, then the first variant exhibits a 0 degree offset, the second variant exhibits a 90 degree offset, the third variant exhibits a 180 degree offset, and the fourth variant exhibits a 270 degree offset, such that 90 degree phase offsets exist between each variant.

Should the variants provided by VCO 306 be differential, then 8 total phase variants of signal $f_{VCO}$ are provided to interpolator 308 for a total of 45 degree phase separation between each variant. Interpolator 308 then selects the correct variant of signal $f_{VCO}$ from VCO 306 and in response to the control word issued by finite state machine (FSM) 320, interpolates from the variant selected to the appropriate phase of signal $f_{VCO}$ that is provided to divide by P 310, such that the phase/frequency error detected by PFD 302 is minimized.

Phase alignment block 214 simultaneously seeks to maintain phase coherency between signal FABRIC CLOCK and signal BYTE CLOCK, where signal FABRIC CLOCK is received from global clock tree 232 of FIG. 2 and signal BYTE CLOCK is the timing reference provided to TX-PCS 204 from phase alignment block 214 during the bypass mode of operation as discussed above. Divide-by-N interger divider 316 receives signal $f_{VCO}$, i.e., bit clock, from VCO 306 and divides the bit clock by N to form signal BYTE CLOCK. Thus, divisor N is equal to the bit length of each data word that is received from signal FABRIC DATA, which in one embodiment is equal to 8 bits per byte.

Phase detector 318 then compares signal BYTE CLOCK to signal FABRIC CLOCK to generate a word clock phase error, which is then provided to FSM 320. Based upon the word clock phase error, FSM 320 provides a binary representation that is representative of the word clock phase error to interpolator 308. In one embodiment, the binary representation may contain 8 bits of data, such that a 256 point resolution of word clock phase error may be represented by the binary representation.

Considering that a total of 360 degrees of word clock phase error may exist and that FSM provides a 256 point resolution, interpolator 308 is then able to resolve the word clock phase error to within 360/256=1.4 degrees. That is to say, in other words, that the frequency of $f_{VCO}$ may be set such that the minimum frequency difference between signals BYTE CLOCK and FABRIC CLOCK may be equal to 1.4 degrees on average.

Thus, while PLL 216 seeks to maintain phase coherency between signals BIT CLOCK and signal REF CLK, phase alignment block 214 seeks to simultaneously maintain phase coherency between signals BYTE CLOCK and FABRIC CLOCK. Any phase/frequency change that may affect signal FABRIC CLOCK, therefore, inherently creates a proportionate change in the phase/frequency of signal BYTE CLOCK. Signal FABRIC CLOCK is distributed to all other transmission channels of the FPGA, so that their transmitter clocks may be phase aligned to FABRIC CLOCK.

In so doing, the lane-lane skew across all transmission channels of the FPGA may be reduced to well below 1 user interval (UI), which equates to one half of a bit clock period for DDR operation and one bit clock period for non-DDR operation. Given that FSM 320 provides a 256-bit resolution, for example, then the lane-lane skew from one transmission channel to the next may be reduced to within +/−1.4 degrees on average.

Figure 4:
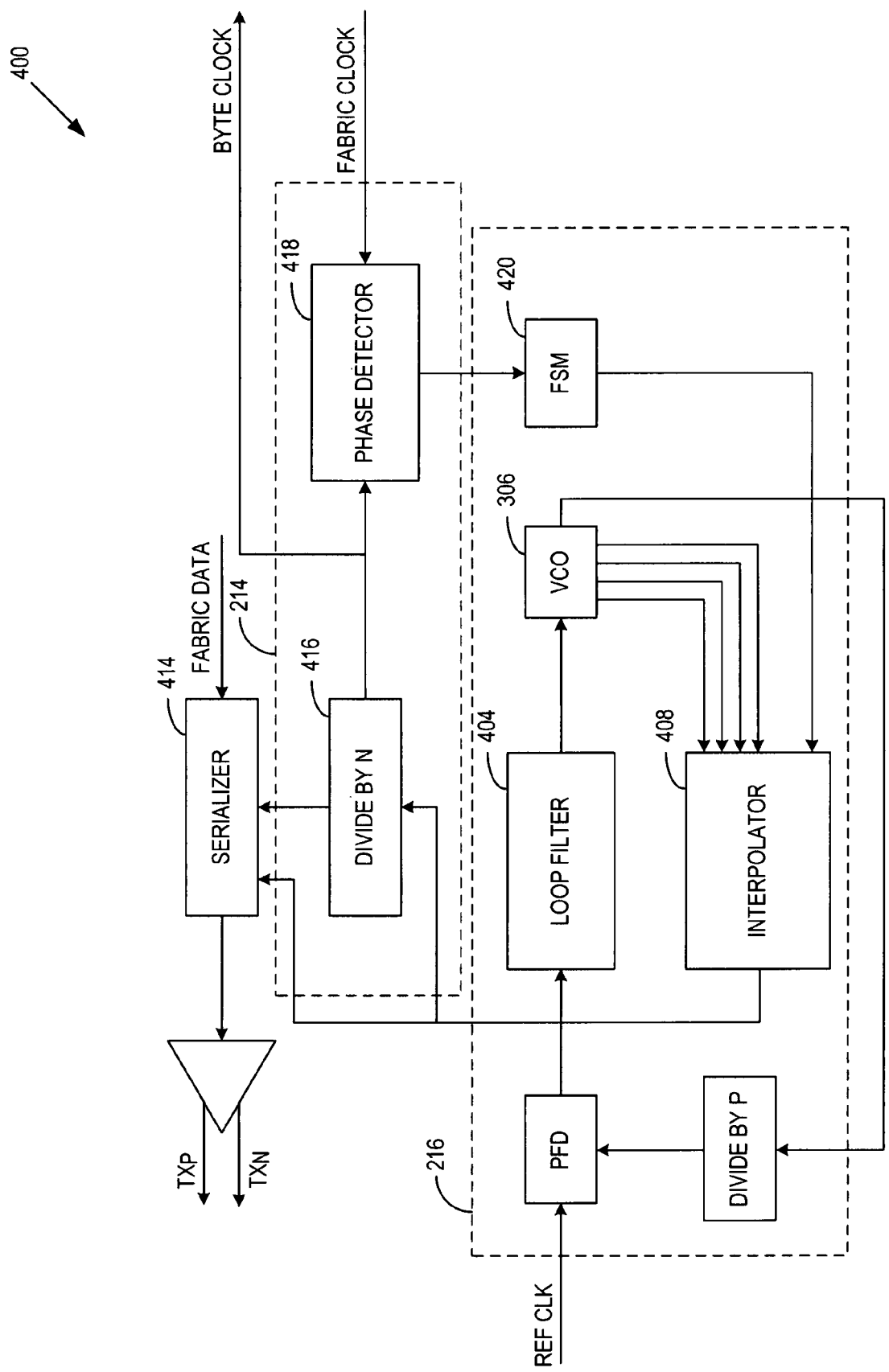
FIG. 4 illustrates an alternate block diagram of the exemplary phase locked loop and phase alignment block portions of the multiple channel transmission bus of FIG. 2.

Turning to FIG. 4, exemplary details of an alternate embodiment of phase alignment block 214 and PLL 216 of TX-PMA 202 are illustrated, whereby interpolator 408 does not exist within the feedback path of PLL 216. Instead, interpolator 408 is coupled in parallel with PLL 216 to provide the interpolated BIT CLOCK signal to both serializer 414 and Divide-by-N integer divider 416. As such, the word clock phase error signal that is generated by phase detector 418 and FSM 420 is not filtered by loop filter 404 and is thus subject to any clock jitter that may exist on signal FABRIC CLOCK. Thus, interpolator 408 may be activated for a few clock cycles to obtain synchronization between signals BYTE CLOCK and FABRIC CLOCK and then deactivated until the next synchronization cycle.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated circuit (IC), comprising:
   a configurable logic fabric coupled to receive configuration data, the configurable logic fabric including programmable logic devices and programmable interconnections that are configured to provide data in response to a fabric clock signal, the fabric clock signal being derived from a reference clock signal; and
   a master transmitter coupled to the configurable logic fabric and adapted to receive the data from the configurable logic fabric in response to a first byte clock signal and adapted to transmit the data in response to a first bit clock signal, the master transmitter including,
      a first phase locked loop (PLL) adapted to generate the first bit clock signal in phase coherency with the reference clock signal; and
      a first phase alignment block coupled to the first PLL and adapted to generate the first byte clock signal in phase coherency with the fabric clock signal.

2. The IC of claim 1, further comprising:
   a slave transmitter coupled to the configurable logic fabric and adapted to receive the data from the configurable logic fabric in response to a second byte clock signal and adapted to transmit the data in response to a second bit clock signal, the slave transmitter including,
      a second PLL adapted to generate the second bit clock signal in phase coherency with the reference clock signal; and
      a second phase alignment block coupled to the second PLL and adapted to generate the second byte clock signal in phase coherency with the fabric clock signal; and
   wherein the first and second bit clock signals are phase aligned to less than one bit clock period.

3. The IC of claim 2, wherein the first phase alignment block comprises:
   a first divider coupled to receive the first bit clock signal and adapted to generate a first integer division of the first bit clock signal; and
   a first phase detector coupled to receive the first integer division of the first bit clock signal and the fabric clock signal and adapted to generate a word clock phase error in response to a phase difference between the first integer division of the first bit clock signal and the fabric clock signal.

4. The IC of claim 3, wherein the first PLL comprises a finite state machine coupled to receive the word clock phase error and adapted to generate a phase control word in response to the word clock phase error.

5. The IC of claim 4, wherein the first PLL further comprises an oscillator coupled to the first divider and adapted to provide a plurality of bit clock signals in response to an error voltage, each of the plurality of bit clock signals having a phase offset relative to each other, wherein one of the plurality of bit clock signals is provided as the first bit clock signal.

6. The IC of claim 5, wherein the first PLL further comprises:
   a second divider coupled to receive the first bit clock signal and adapted to provide a second integer division of the first bit clock signal; and
   a second phase detector coupled to receive the second integer division of the first bit clock signal and the reference clock signal and adapted to detect a phase difference between the second integer division of the first bit clock signal and the reference clock signal.

7. The IC of claim 6, wherein the first PLL further comprises a first loop filter coupled to the second phase detector and the oscillator and adapted to generate the error voltage.

8. The IC of claim 7, wherein the first PLL further comprises a phase interpolator coupled within the feedback path of the first PLL, the phase interpolator coupled to receive the plurality of bit clock signals and the phase control word and adapted to provide the second divider with a phase of the bit clock signal having the least phase error with respect to a phase of the reference clock signal.

9. The IC of claim 7, wherein the first PLL further comprises a phase interpolator coupled outside of the feedback path of the first PLL, the phase interpolator coupled to receive the plurality of bit clock signals and the phase control word and adapted to provide the first divider with a phase of the bit clock signal having the least phase error with respect to a phase of the reference clock signal.

10. A programmable logic device (PLD), comprising:
   a configurable logic fabric adapted to provide data for transmission from the PLD;
   a plurality of transceivers configured to receive the data and adapted to provide a multiple channel transmission bus to transmit the data, each transceiver including,
      a physical coding sublayer (PCS) coupled to receive the data into an input register in synchronization with a first clock signal provided by the configurable logic fabric, the PCS including an elastic buffer programmably decoupled from an output of the input register in a first mode; and
      a physical media access (PMA) block adapted to receive the data from an output register of the PCS in synchronization with a second clock signal derived by the PMA block, the output register programmably coupled to the input register to bypass the elastic buffer in the first mode;
   wherein the PMA block maintains the second clock signal in phase alignment with the first clock signal in the first mode.

11. The PLD of claim 10, wherein each PMA block comprises:

a phase locked loop (PLL) adapted to generate a bit clock signal in phase coherency with a reference clock signal; and a phase alignment block coupled to the PLL and adapted to generate the second clock signal in phase coherency with the first clock signal, wherein the PMA block of a first transceiver of the plurality of transceivers is adapted to distribute the reference clock signal to a PMA block of the remaining transceivers.

12. The PLD of claim 11, wherein the phase alignment block comprises:
a first divider coupled to receive the bit clock signal and adapted to generate a first integer division of the bit clock signal; and
a first phase detector coupled to receive the first integer division of the bit clock signal and the first clock signal and adapted to generate a word clock phase error in response to a phase difference between the first integer division of the bit clock signal and the first clock signal.

13. The PLD of claim 12, wherein the PLL comprises:
a finite state machine coupled to receive the word clock phase error and adapted to generate a phase control word in response to the word clock phase error; and
an oscillator coupled to the first divider and adapted to provide a plurality of bit clock signals in response to an error voltage, each of the plurality of bit clock signals having a phase offset relative to each other, wherein one of the plurality of bit clock signals is provided as the bit clock signal.

14. The PLD of claim 13, wherein the PLL further comprises:
a second divider coupled to receive the bit clock signal and adapted to provide a second integer division of the bit clock signal;
a second phase detector coupled to receive the second integer division of the bit clock signal and the reference clock signal and adapted to detect a phase difference between the second integer division of the bit clock signal and the reference clock signal; and
a loop filter coupled to the second phase detector and the oscillator and adapted to generate the error voltage.

15. The PLD of claim 14, wherein the PLL further comprises a phase interpolator coupled within the feedback path of the PLL, the phase interpolator coupled to receive the plurality of bit clock signals and the phase control word and adapted to provide the second divider with a phase of the bit clock signal having the least phase error with respect to a phase of the reference clock signal.

16. The PLD of claim 14, wherein the PLL further comprises a phase interpolator coupled outside of the feedback path of the PLL, the phase interpolator coupled to receive the plurality of bit clock signals and the phase control word and adapted to provide the first divider with a phase of the bit clock signal having the least phase error with respect to a phase of the reference clock signal.

17. A transmission system, comprising:
a first transmitter coupled to transmit data to a transmission medium, the first transmitter including,
a configurable logic fabric coupled to receive configuration data to configure programmable logic devices and programmable interconnections within the configurable logic fabric to provide the data in synchronization with a fabric clock signal;
a physical coding sublayer (PCS) block coupled to receive the data into an input register in synchronization with the fabric clock signal provided by the configurable logic fabric; and
a physical media access (PMA) block adapted to receive the data from an output register of the PCS block in synchronization with a byte clock signal provided by the PMA block;
wherein the PMA block maintains the byte clock signal in phase alignment with the fabric clock signal.

18. The transmission system of claim 17, wherein the PMA block comprises:
a phase locked loop (PLL) adapted to generate a bit clock signal in phase coherency with a reference clock signal; and
a phase alignment block coupled to the PLL and adapted to generate the byte clock signal in phase coherency with the fabric clock signal, wherein the PMA block of the first transmitter is adapted to distribute the reference clock signal to a PMA block of a second transmitter.

19. The transmission system of claim 18, wherein the phase alignment block comprises:
a first divider coupled to receive the bit clock signal and adapted to generate a first integer division of the bit clock signal; and
a first phase detector coupled to receive the first integer division of the bit clock signal and the fabric clock signal and adapted to generate a word clock phase error in response to a phase difference between the first integer division of the bit clock signal and the fabric clock signal.

20. The transmission system of claim 19, wherein the PLL comprises:
a second divider coupled to receive the bit clock signal and adapted to provide a second integer division of the bit clock signal;
a second phase detector coupled to receive the second integer division of the bit clock signal and the reference clock signal and adapted to detect a phase difference between the second integer division of the bit clock signal and the reference clock signal;
a loop filter coupled to the second phase detector and the oscillator and adapted to generate the error voltage; and
a phase interpolator coupled within the feedback path of the PLL, the phase interpolator coupled to receive the plurality of bit clock signals and the phase control word and adapted to provide the second divider with a phase of the bit clock signal having the least phase error with respect to a phase of the reference clock signal.

* * * * *